US006971081B2

(12) United States Patent
Ramakrishnan

(10) Patent No.: US 6,971,081 B2
(45) Date of Patent: Nov. 29, 2005

(54) ROUTING FOR REDUCING IMPEDANCE DISTORTIONS

(75) Inventor: Arun Ramakrishnan, Sunnyvale, CA (US)

(73) Assignee: LSI Logic Corporation, Milpitas, CA (US)

( * ) Notice: Subject to any disclaimer, the term of this patent is extended or adjusted under 35 U.S.C. 154(b) by 251 days.

(21) Appl. No.: 10/672,538

(22) Filed: Sep. 26, 2003

(65) Prior Publication Data

US 2005/0071799 A1    Mar. 31, 2005

(51) Int. Cl.[7] ............................................. G06F 17/50
(52) U.S. Cl. ........................................ 716/9; 716/15
(58) Field of Search ........................................ 716/9, 15

(56) References Cited

U.S. PATENT DOCUMENTS

| | | | | |
|---|---|---|---|---|
| 4,852,016 A | * | 7/1989 | McGehee | 716/12 |
| 5,754,826 A | * | 5/1998 | Gamal et al. | 703/14 |
| 5,966,593 A | * | 10/1999 | Budnaitis et al. | 438/118 |
| 6,046,060 A | * | 4/2000 | Budnaitis | 438/10 |
| 6,671,858 B2 | * | 12/2003 | Ikeda | 716/1 |
| 6,826,741 B1 | * | 11/2004 | Johnson et al. | 716/12 |
| 6,925,627 B1 | * | 8/2005 | Longway et al. | 716/13 |
| 2005/0022149 A1 | * | 1/2005 | Smith et al. | 716/15 |

* cited by examiner

Primary Examiner—Stacy A. Whitmore
(74) Attorney, Agent, or Firm—Luedeka, Neely & Graham, P.C.

(57) ABSTRACT

A substrate having a core with vias disposed therein. A reference layer is formed on the core, with voids in the reference layer that are formed around the vias in the core. Traces on a routing layer overlie the reference layer. Also included is a contact layer with contacts disposed in a contact pattern. The core is logically divided into sections, and the vias within a given one of the sections are aligned in rows substantially along a first direction. At least a portion of the vias are not aligned with the contact pattern. The voids in the reference layer within the given one of the sections are also aligned in rows substantially along the first direction and aligned with the vias. Further, the traces within the given one of each of the sections are also aligned substantially along the first direction between the rows of voids, and not substantially overlying the rows of voids.

20 Claims, 2 Drawing Sheets

ROUTING FOR REDUCING IMPEDANCE DISTORTIONS

FIELD

This invention relates to the field of integrated circuit fabrication. More particularly, this invention relates to the design of substrates and circuit boards.

BACKGROUND

Integrated circuits, such as bump bonded flip chip integrated circuits, are typically electrically and mechanically housed in a package prior to use in a larger circuit. The package provides several important functions for the integrated circuit. First, the package provides mechanical and structural support to the integrated circuit, and thus protects it from physical damage. Additionally, the substrate, which is the interposer between the integrated circuit and the printed circuit board and forms the base of the package, physically spreads out, or routes, the electrical connections that are made to the integrated circuit on one side of the substrate, so that electrical connections to other parts of the overall circuit, such as to a printed circuit board, can be more easily made on the other side of the substrate.

One type of substrate is fabricated with a relatively rigid sheet of a non-electrically conductive material, called a core, upon which one or more build-up layers are formed, typically on both sides of the core. For example, the core may have electrically conductive layers formed on both of its sides, which are then covered with a non-electrically conductive layer, and then another electrically conductive layer, and so on until the desired number of electrically conductive layers have been formed.

The electrically conductive layers in the substrate are patterned, typically at the time that they are formed, so as to provide specific functions. For example, on an electrically conductive layer on which signals from the integrated circuit are conducted, the layer typically includes a plurality of electrically conductive lines or signal traces, which route the signal from one part of the substrate, such as an inner portion, to a different part of the substrate, such as a more peripheral portion. An electrically conductive layer that provides a ground plane is typically a large, contiguous, electrically conductive sheet. Finally, an electrically conductive layer that provides a power plane typically includes multiple electrically conductive sheets that do not electrically connect one with another, at least not on that same layer.

Electrical connections from one to another of the electrically conductive layers of the substrate are provided by forming holes in the non-electrically conductive layers between them, and either coating or filling the holes with an electrically conductive material. Such structures are called vias. Vias typically must also be formed through the substrate core. These core vias can be formed by mechanical or laser drilling. Because the core is typically much thicker than any of the build-up layers, core vias are often much larger than the vias that extend between the electrically conductive build-up layers.

Unfortunately, the large size of the core vias can present problems when designing a substrate. For example, a standard core for a substrate has electrically conductive layers formed on either side, and core vias drilled through it that connect to, and often align with, signal balls. When the electrically conductive layers formed on the core serve as reference layers, such as power or ground planes, for signals routed on the layers above or below the core, then some clearance has to be provided between the signal core vias and the electrically conductive portions of the reference layers, to ensure that the vias do not short to the reference layer. These clearances are called voids herein, and are formed around the vias on the reference layer. The voids tend to utilize a relatively large amount of space on that layer. However, it is desirable that the signal traces on the routing layer overlying or underlying the reference layer remain predominantly over the conductive portions of the reference layer, and not travel over the voids in the reference layer. When the signal traces travel over the voids, there tend to be problems with inconsistent impendence.

Various solutions have been proposed for this problem of preventing signal traces from routing over voids on their reference planes, including forming the signal traces with narrower widths, or more closely spaced together, so as to be able to fit the signal traces within the small spaces of the reference layer that are left between the voids formed around the core vias. Alternately, the substrate can be made larger so as to increase the amount of room available between the voids for the signal traces. However, these solutions introduce new problems. Signal traces with narrower widths do not conduct the signals as well and tend to have higher resistance. Signal traces that are more closely spaced together tend to have an increase in crosstalk between the signals conducted on the traces. Finally, larger substrates require more space within the circuit in which they are used, which is generally undesirable for most applications.

What is needed, therefore, is a substrate design that provides more usable space for signal trace routing without running signal traces over voids, and without increasing the size of the substrate.

SUMMARY

The above and other needs are met by an improvement to a substrate having an electrically nonconductive core with vias disposed therein. An electrically conductive reference layer is formed on the electrically nonconductive core, with voids in the electrically conductive reference layer that are formed around and aligned with the vias in the electrically nonconductive core. Electrically conductive traces on a routing layer overlie the electrically conductive reference layer. Also included is a contact layer with electrically conductive contacts disposed in a contact pattern. The core is logically divided into sections, and the vias within a given one of each of the sections are aligned in rows substantially along a first direction. At least a portion of the vias are not aligned with the contact pattern. The voids in the reference layer within the given one of each of the sections are also aligned in the same rows substantially along the first direction, since they are formed directly around the vias and aligned with the vias. Further, the traces on the overlying routing layer within the given one of each of the sections are also aligned substantially along the first direction between the rows of voids, and not substantially overlying the rows of voids.

In this manner, the voids in the reference layer are substantially aligned within a given section of the substrate, and thus there are relatively large and unbroken corridors of space between the voids where the reference layer exists. Thus, there are also relatively large and unbroken corridors over which the signal traces can be routed, without having to overlie the voids. Thus, the signal traces do not need to be crowded too closely one to another, nor do they need to overlie the voids. Rather, they can remain well referenced to the underlying reference layer. By rearranging the core vias and the voids for these vias in this manner, space within each of the logical sections of the substrate is better utilized, and the electrical characteristics of the substrate are improved without increasing the size of the substrate.

In various preferred embodiments, the voids aligned within a given row are interconnected. The rows of vias within each of the sections of the core are all disposed in a same direction in one embodiment, and in another embodiment the rows of vias within each of the sections of the core are not all disposed in a same direction. In yet another embodiment the first direction of the rows of vias within the given one of each of the sections is substantially disposed along a logical radial line from the center of the substrate. In alternate embodiments, the reference layer is either a power layer or a ground layer. Also described is a packaged integrated circuit that includes the substrate described above. In addition, a printed circuit board is also described.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
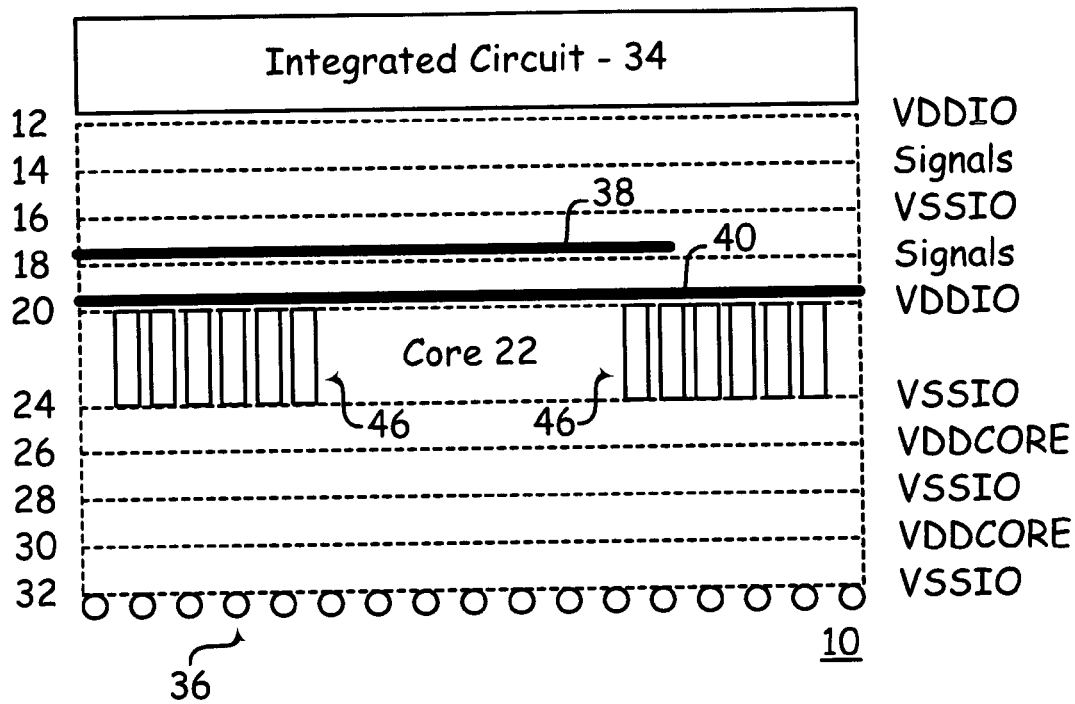
FIG. 1 is a cross sectional view of a portion of a substrate depicting the core, core vias, and various layers on the core, including a reference layer and a signal trace layer.

With reference now to FIG. 1 there is depicted a cross sectional view of a portion of a substrate 10. The embodiments of the invention as described herein are applicable to the cases where the substrate 10 is either a substrate or a printed circuit board. In either case, the substrate 10 is generally used to route signals from a generally central location on one side of the substrate 10 to generally more dispersed locations on the opposite of the substrate 10. Thus, although the descriptions provided below are given in regard to the specific case of a substrate, it is appreciated that the invention is applicable as well to a printed circuit board. It is also appreciated that, while the substrate 10 depicted in FIG. 1 is a ten-layer substrate, the invention is equally applicable to substrates having four layers, six layers, eight layers, or other numbers of layers, with signals routed either above or below the core 22.

In the specific embodiment depicted in FIG. 1, the substrate 10 includes a core 22 with four build-up layers on either side of the core 22. Specifically, the substrate 10 has a first electrically conductive layer 20 that is formed directly on a first side of the core 22, and then four build-up layers 12, 14, 16, and 18 on top of the first side of the core 22, where layer 12 is the upper most layer on the first side of the substrate 10. Similarly, the substrate 10 has a second electrically conductive layer 24 that is formed directly on a second opposing side of the core 22, and then four build-up layers 26, 28, 30, and 32 on top of the second side of the core 22, where layer 32 is the upper most layer on the second side of the substrate 10. It is appreciated that the number of layers as depicted in FIG. 1 is representative only, and that in various embodiments of the invention, the substrate 10 may include either a greater or a lesser number of such build-up layers, within the constraints as dictated by the description contained herein.

The electrically conductive layers are disposed between non-electrically conductive layers, which electrically insulate the electrically conductive layers one from another. In the example as depicted in FIG. 1, an integrated circuit 34 is electrically connected to contacts on the upper most layer 12 of the substrate 10. Also as depicted in FIG. 1, electrical contacts 36 are provided on the lower most layer 32 of the substrate 10. The electrical contacts 36 are depicted as ball contacts, but may be of another type, and are used for making electrical connections between the packaged integrated circuit assembly and other portions of a larger circuit in which the packaged integrated circuit is used.

FIG. 1 also provides a legend on the right hand side of the figure, in which there is given the layer designations for a very specific embodiment of the invention. In this specific embodiment, the upper most layer 12 includes a VDDIO structure 36, which is the power plane for the input/output circuitry disposed in an outer portion of the integrated circuit. Layer 16 includes a VSSIO structure 38, which is the ground plane for all the input/output circuitry in the integrated circuit. Layer 20 includes a VDDIO structure 40, which is the power plane for the input/output circuitry disposed in an inner portion of the integrated circuit. Layers 14 and 18 contain the circuitry routing to the outer and inner portions of the integrated circuit, respectively.

In the embodiment depicted in FIG. 1, the signal traces 38 on layer 18 are preferably referenced to the power plane 40 on layer 20. The best referencing is provided when the signal traces 38 do not overlie any voids within the power plane 40, which is generally referred to herein as the reference layer 40. It is appreciated that the reference layer 40 may be either a power (VDD) layer or a ground (VSS) layer.

Figure 2:
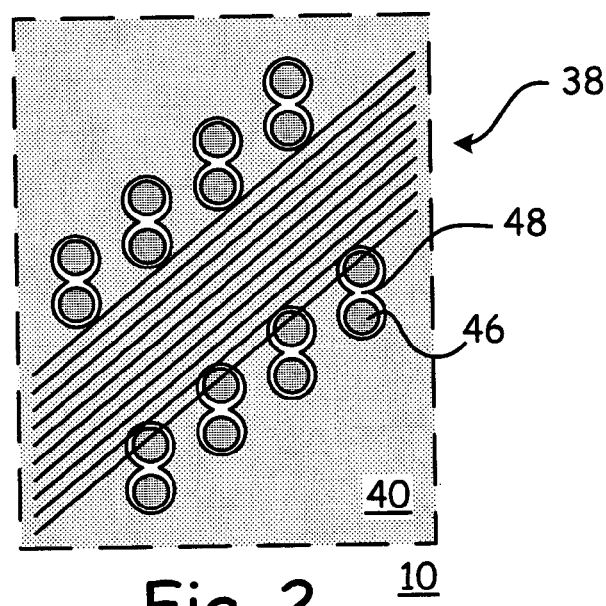
FIG. 2 is a top plan view of a logical section of the substrate depicting the relative alignment between core vias, voids in the reference layer, and signal traces, where the signal traces overlie the voids around the core vias.

With reference now to FIG. 2, there is depicted a top plan view of a logical section of the substrate 10, depicting the relative alignment between core vias 46 in the core 22, voids 48 in the reference layer 40, and signal traces 38, where the signal traces 38 overlie the voids 48 around the core vias 46. By "logical section" it is meant that this is a portion somewhere within the whole of the substrate 10, but there are no actual lines or other markings on the substrate 10 itself which would delineate one logical section from another.

As mentioned above, the embodiment depicted in FIG. 2 is not a preferred embodiment, as there are irregularities in the impedance of the signal traces 38 between those areas that are properly referenced and those areas that are not, such as between those portions of the signal traces 38 which overlie the reference plane 40 and those portions of the signal traces 38 which overlie the voids 48. It can also be seen that the arrangement of the vias 46 produces many gaps between two adjacent voids 48 in which signal traces 38 cannot easily be routed without running over the voids 48.

Figure 3:
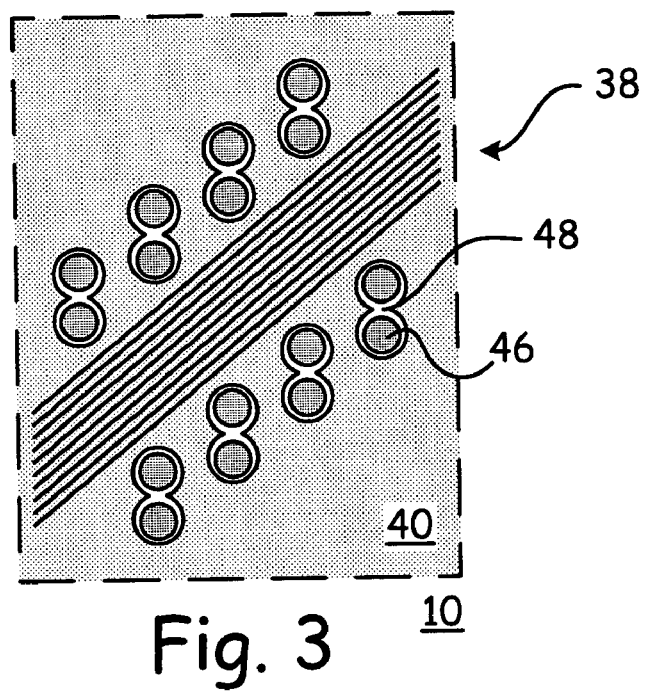
FIG. 3 is a top plan view of a logical section of the substrate depicting the relative alignment between core vias, voids in the reference layer, and signal traces, where the signal traces have been placed closer together so as to not overlie the voids around the core vias.

With reference now to FIG. 3, there is depicted a top plan view of a logical section of the substrate 10, depicting the relative alignment between core vias 46, voids 48 in the reference layer 40, and signal traces 38, where the signal traces 38 have been placed closer together so as to not overlie the voids 48 around the core vias 46. As mentioned above, this is also not a preferred embodiment, as the close proximity of the signal traces 38 to each other tends to increase the degree of crosstalk that is experienced between the signals. As before, the arrangement of the vias 46 produces many gaps between the adjacent voids 48 in which signal traces 38 cannot easily be routed without running over the voids 48.

Figure 4:
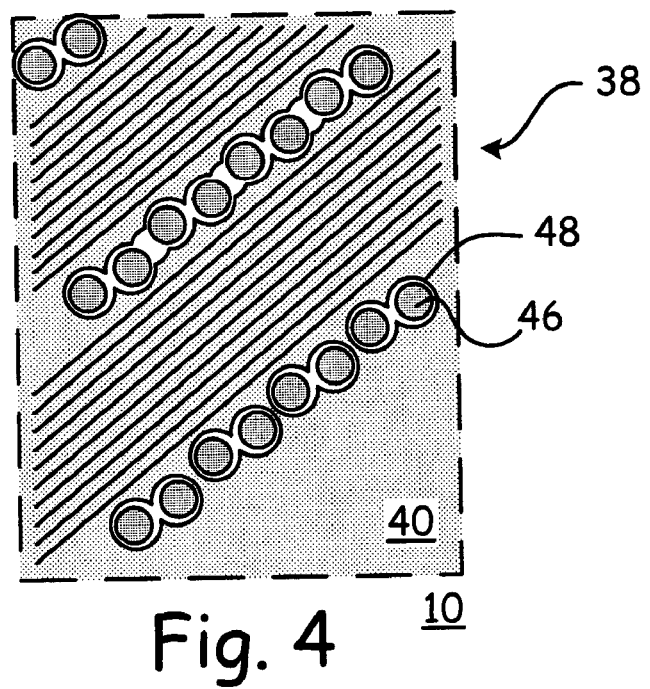
FIG. 4 is a top plan view of a logical section of the substrate depicting the relative alignment between core vias, voids in the reference layer, and signal traces, where the core vias and voids have been realigned so that the signal traces do not overlie the voids around the core vias.

With reference now to FIG. 4, there is depicted a top plan view of a logical section of the substrate 10, depicting the relative alignment between core vias 46, voids 48 in the reference layer 40, and signal traces 38, where the core vias 46 and voids 48 have been realigned so that the signal traces 38 do not overlie the voids 48 around the core vias 46. In this preferred embodiment, the signal traces 38 are neither narrowed, so there is no impact on their resistance, nor are they crowded together such that crosstalk between them increases. However, they also do not substantially overlie the voids 48 in the reference layer 40, so the impedance of the signal traces 38 is not disrupted in that manner, and the signal traces 38 are well referenced to the reference layer 40.

The benefits of the embodiment as depicted in FIG. 4 are enabled by having the signal traces 38, the vias 46, and the voids 48 substantially aligned in rows that are directed along a given direction. In this manner, good use is made of the space available for the signal traces 38, and the substrate 10 does not need to be made larger in order to accommodate all the desired signal traces 38 without resorting to the non-preferred embodiments described above. In other words, the space on the substrate 10 is compacted between rows of vias 46 and voids 48, so that there are fewer unusable gaps between them. As depicted in FIG. 4, some or all of the voids 48 may be linked together to form a continuous void around a row of vias 46.

One important difference between the embodiment depicted in FIG. 4 and the embodiments depicted in FIGS. 2 and 3 is the alignment of the vias 46 and voids 48 within the logical section depicted. Typically, the core vias 46 are aligned to some structure within the substrate 10 other than the signal traces 38. For example, the core vias 46 can be aligned with reference to the contacts 36 which make electrical connections to the outside circuitry, such as the ball contacts. When the core vias 46 are aligned to some other structure in this manner, the voids 48 are automatically aligned in the same manner, and then the signal traces 38 must be routed as best as can be done around the orientation of the voids 48.

However, in the embodiment as depicted in FIG. 4, the core vias 46 within the depicted logical section of the substrate 10 are aligned substantially in rows in generally the same direction as the desired routing of the signal traces 38 within that same logical section. Thus, the voids 48 are also substantially aligned in rows that travel in the same general direction as the signal traces 38 in that logical section of the substrate 10. In this manner, the various structures are aligned with reference to the desired routing of the signal traces 38, and not with reference to some other structure. Thus, there is more space that is usable for the routing of the signal traces 38, and less space that is undesirably disposed in gaps between the voids 48.

Thus, the vias 46 and voids 48 within each logical section are preferably aligned according to the desired routing of the signal traces 38 within that logical section. This alignment may be, in various embodiments, in the same general direction within all logical sections of the substrate 10, or more preferably may be in different general directions within the various logical sections of the substrate 10. For example, the general direction for each logical section may be generally along a radial line extending from the center of the substrate 10 and through the logical section to the peripheral edge of the substrate 10. In most embodiments, the general direction of alignment within a given logical section will be different from section to section, but generally along radial lines of the substrate 10 as the signals are routed generally outwardly from a relatively small and centrally located integrated circuit 34 to contacts 36 that are located generally toward the peripheral edges of the substrate 10.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. In a substrate having an electrically nonconductive core with vias disposed therein and an electrically conductive reference layer formed on the electrically nonconductive core with voids in the electrically conductive reference layer that are formed around the vias in the electrically nonconductive core and electrically conductive traces on a routing layer overlying the electrically conductive reference layer, and a contact layer with electrically conductive contacts disposed in a contact pattern, the improvement comprising the core logically divided into sections, the vias within a given one of each of the sections aligned in rows substantially along a first direction and not aligned with the contact pattern, the voids in the reference layer within the given one of each of the sections also aligned in rows substantially along the first direction and aligned with the vias, and the traces within the given one of each of the sections also aligned substantially along the first direction between the rows of voids and not substantially overlying the rows of voids.

2. The substrate of claim 1, wherein the voids aligned within a given row are interconnected.

3. The substrate of claim 1, wherein the rows of vias within each of the sections of the core are all disposed in a same direction.

4. The substrate of claim 1, wherein the rows of vias within each of the sections of the core are not all disposed in a same direction.

5. The substrate of claim 1, wherein the first direction of the rows of vias within the given one of each of the sections is substantially disposed along a logical radial line from a center of the substrate.

6. The substrate of claim 1, wherein the reference layer is a power layer.

7. The substrate of claim 1, wherein the reference layer is a ground layer.

8. The substrate of claim 1, wherein the contacts on the contact layer are adapted for receiving ball bonds.

9. A packaged integrated circuit including the substrate of claim 1.

10. In a substrate having an electrically nonconductive core with vias disposed therein and an electrically conductive reference layer formed on the electrically nonconductive core with voids in the electrically conductive reference layer that are formed around the vias in the electrically nonconductive core and electrically conductive traces on a routing layer overlying the electrically conductive reference layer, and a contact layer with electrically conductive contacts disposed in a contact pattern, the improvement comprising the core logically divided into sections, the vias within a given one of each of the sections aligned in rows substantially along a first direction where at least a portion of the vias are not aligned with the contact pattern, the voids in the reference layer within the given one of each of the sections also aligned in rows substantially along the first direction and aligned with the vias, and the traces within the given one of each of the sections also aligned substantially along the first direction between the rows of voids and not substantially overlying the rows of voids.

11. The substrate of claim 10, wherein the voids aligned within a given row are interconnected.

12. The substrate of claim 10, wherein the rows of vias within each of the sections of the core are all disposed in a same direction.

13. The substrate of claim 10, wherein the rows of vias within each of the sections of the core are not all disposed in a same direction.

14. The substrate of claim 10, wherein the first direction of the rows of vias within the given one of each of the sections is substantially disposed along a logical radial line from a center of the substrate.

15. The substrate of claim 10, wherein the reference layer is a power layer.

16. The substrate of claim 10, wherein the reference layer is a ground layer.

17. A packaged integrated circuit including the substrate of claim 10.

18. In a printed circuit board having an electrically nonconductive core with vias disposed therein and an electrically conductive reference layer formed on the electrically nonconductive core with voids in the electrically conductive reference layer that are formed around the vias in the electrically nonconductive core and electrically conductive traces on a routing layer overlying the electrically conductive reference layer, and a contact layer with electrically conductive contacts disposed in a contact pattern, the improvement comprising the core logically divided into sections, the vias within a given one of each of the sections aligned in rows substantially along a first direction and not aligned with the contact pattern, the voids in the reference layer within the given one of each of the sections also aligned in rows substantially along the first direction and aligned with the vias, and the traces within the given one of each of the sections also aligned substantially along the first direction between the rows of voids and not substantially overlying the rows of voids.

19. The printed circuit board of claim 18, wherein the voids aligned within a given row are interconnected.

20. The printed circuit board of claim 18, wherein the rows of vias within each of the sections of the core are not all disposed in a same direction.

* * * * *